United States Patent [19]
Robles

[11] Patent Number: 5,804,259
[45] Date of Patent: Sep. 8, 1998

[54] METHOD AND APPARATUS FOR DEPOSITING A MULTILAYERED LOW DIELECTRIC CONSTANT FILM

[75] Inventor: Stuardo Robles, Sunnyvale, Calif.

[73] Assignee: Applied Materials, Inc., Santa Clara, Calif.

[21] Appl. No.: 749,290

[22] Filed: Nov. 7, 1996

[51] Int. Cl.$^6$ .............................. H05H 1/24; B05D 5/12; H01L 21/02; C23C 16/00

[52] U.S. Cl. .......................... 427/577; 427/122; 427/249; 427/255.6; 427/255.7; 438/780; 438/784; 438/763; 438/584

[58] Field of Search .................................. 427/525, 530, 427/490, 577, 249, 255.6, 255.7, 412.2, 122; 204/192.22, 192.16; 438/584, 761, 763, 780, 783, 784

[56] References Cited

U.S. PATENT DOCUMENTS

| | | | |
|---|---|---|---|
| 4,743,327 | 5/1988 | De Haan et al. | 427/490 |
| 4,938,995 | 7/1990 | Giordano et al. | 427/490 |
| 5,089,290 | 2/1992 | Kleeberg et al. | 427/490 |
| 5,198,263 | 3/1993 | Stafford et al. | 427/577 |
| 5,238,705 | 8/1993 | Hayashi et al. | 427/122 |
| 5,270,082 | 12/1993 | Lin et al. | 427/255.6 |
| 5,276,537 | 1/1994 | Savant et al. | 427/577 |
| 5,290,383 | 3/1994 | Koshimizu | 156/345 |
| 5,302,420 | 4/1994 | Nguyen et al. | 427/490 |
| 5,368,937 | 11/1994 | Itoh | 427/577 |
| 5,380,557 | 1/1995 | Spiro | 427/577 |
| 5,424,097 | 6/1995 | Olson et al. | 427/255.6 |
| 5,429,995 | 7/1995 | Nishiyama et al. | 437/238 |
| 5,491,002 | 2/1996 | Slutz | 427/577 |
| 5,512,330 | 4/1996 | Dearnaley | 427/252 |
| 5,518,766 | 5/1996 | Bigelow et al. | 427/577 |
| 5,563,105 | 10/1996 | Dobuzinsky et al. | 437/240 |
| 5,614,055 | 3/1997 | Fairbairn et al. | 156/345 |
| 5,638,251 | 6/1997 | Goel et al. | 427/122 |
| 5,643,640 | 7/1997 | Chakravarti et al. | 427/578 |

OTHER PUBLICATIONS

F.S. Wing, *The Complete Book of Decoupage*; Coward–McCann, Inc., New York 1965 (no month); excerpt pp. 101–109.

D. Carl et al., "The Effect of $O_2$:$C_2F_6$ Ratios and Low Frequency Power on the Gap Fill Properties and Stability of F–TEOS Films," *DUMIC Conference*, Feb. 21–22, 1995, pp. 234–240, Feb. 1995.

Neil H. Hendricks, "Organic Polymers for IC Intermetal Dielectric Applications," *Solid State Technology*, pp. 1–4, Jul. 1995.

*Primary Examiner*—Marianne Padgett
*Attorney, Agent, or Firm*—Townsend and Townsend and Crew LLP

[57] ABSTRACT

A method and apparatus for forming a multilayer insulating film on a substrate involves forming a number of carbon-based layers on the substrate, each interlaid with layers of organic material, such as parylene. Preferably, the carbon-based layers are formed using a high-density plasma chemical vapor deposition system, although other CVD systems may also be used. The result is a multilayer insulating film having a low overall dielectric constant, excellent gap-fill characteristics, and desirable thermal properties.

18 Claims, 8 Drawing Sheets

METHOD AND APPARATUS FOR DEPOSITING A MULTILAYERED LOW DIELECTRIC CONSTANT FILM

BACKGROUND OF THE INVENTION

The present invention relates to the fabrication of integrated circuits. More particularly, the invention provides a technique, including a method and apparatus, for the deposition of an insulating film having a reduced dielectric constant.

Many very large-scale integrated (VLSI) semiconductor devices employ multilevel interconnects to increase the packing density of devices on a wafer. Intermetal dielectric (IMD) layers provide an insulative layer between metallization layers to reduce the capacitance between layers. The dielectric constant of these layers has a direct impact on the size of device that can be produced. For example, one semiconductor industry association projects that the ability to mass produce sub 0.25-$\mu$m design-rule devices will require the use of IMD layers having dielectric constants of 2.9 or less. Thus, there is a continuing need for IMD layers having reduced dielectric constants.

Other properties of these IMD layers are also important. For example, IMD layers should have good "gap-fill" characteristics, namely, the layers should exhibit good step coverage and planarization properties to produce void-free layers that not only completely fill steps and openings in the underlying substrate, but also form smooth planarized dielectric layers. The layers should be able to be deposited at low temperatures, preferably below about 400° C. to avoid damage to underlying metallization layers.

A number of existing approaches to the deposition of IMD layers include the formation and deposition of several layers of silicon oxide film. This deposition typically is performed using chemical vapor deposition (CVD). Conventional thermal CVD processes supply reactive gases to the substrate surface where heat-induced chemical reactions take place to produce a desired film.

One particular process that has been used successfully to fill gaps with an aspect ratio of 2:1 or higher is the deposition of a multilayer silicon oxide dielectric film. An example of such a multilayer silicon oxide film is described in U.S. Pat. No. 5,000,113, entitled "Thermal CVD/PECVD Reactor and Use for Thermal Chemical Vapor Deposition of Silicon Dioxide and In-situ Multi-step Planarized Process," issued to Wang et al. and assigned to Applied Materials, Inc., the assignee of the present invention.

In this process, a first layer (referred to as the "lining layer") of thin silicon oxide is deposited over the stepped topography of a substrate using plasma-enhanced CVD (PECVD) techniques. A second layer of silicon oxide is then deposited over the lining layer. This second layer is formed by thermal CVD deposition of a silicon oxide layer from tetraethylorthosilicate (TEOS) and ozone ($O_3$) precursor gases. Such a TEOS/ozone/silicon oxide film is deposited under pressure conditions in the range of about 100–700 torr, and is therefore commonly referred to as a subatmospheric CVD (SACVD) film. The PECVD lining layer functions as an initial lining layer and diffusion barrier for the overlying SACVD layer; it fills in the gaps between the metal lines and improves the uniformity and rate of deposition of the SACVD layer.

Although these multilayer PECVD/SACVD films have been found to have desirable qualities, they do not satisfy the continuing need for films having reduced dielectric constants. Typical PECVD/SACVD films have dielectric constants of 4.0 or more. There is, accordingly, a need for insulating films having reduced dielectric constants that are suitable for use in, e.g., IMD layers.

Organic materials, including polymers, have been found to have low dielectric constants. Jeng et al. in "A Planarized Multilevel Interconnect Scheme with Embedded Low-Dielectric Constant Polymers for Sub-Quarter Micron Applications", published in the Journal of Vacuum and Technology in June 1995, discuss the use of a low dielectric constant polymeric material, such as parylene, as a substitute for silicon dioxide ($SiO_2$) between tightly spaced conductor lines or other strategically important areas of an integrated circuit structure. These polymeric materials also exhibit highly desirable gap-fill characteristics.

Unfortunately, however, polymeric materials such as parylene are relatively unstable both chemically and structurally. The chemical stability of polymeric films can be affected by deposition temperatures and ion migration during deposition. Structurally, parylene does not have the mechanical strength exhibited by other materials suitable for IMD applications. Parylene tends to smear, making it a difficult material to planarize. Parylene also has long-term structural stability concerns. During use, temperatures and field effects can further degrade stability of the film.

Organic films such as parylene also suffer in that they have a low thermal conductivity. This can result in device overheating during use and can also lead to device failure resulting from ion migration.

Accordingly, there is a need for a reduced dielectric constant insulating film that takes advantage of the beneficial characteristics of organic films, and that improves the stability and thermal characteristics of the film.

SUMMARY OF THE INVENTION

The present invention addresses these requirements by providing an insulating film having a reduced dielectric constant and desirable gap-fill characteristics.

According to one embodiment of the invention, a method for forming an insulating film on a substrate involves forming a number of carbon-based layers on the substrate, each interlaid with layers of polymeric material, such as parylene. Preferably, the carbon-based layers are formed using a high-density plasma chemical vapor deposition (HDP-CVD) system, although other CVD systems may also be used. The result is a multilayer insulating film having a low overall dielectric constant, excellent gap-fill characteristics, and desirable thermal properties.

Properties of the multilayer film may be adapted by changing the number and composition of each of the layers. For example, in a currently preferred embodiment, the initial layer of carbon film deposited is formed using a process gas formed from a greater proportion of methane than freon-14 ($CF_4$). This produces a stable base layer for the multilayer film. Subsequent carbon-based layers can be deposited with greater proportions of Freon-14 to reduce the film's dielectric constant.

It is believed that the layers of carbon-based film tend to stabilize the layers of polymer film, producing a multilayer film with a low dielectric constant. The carbon-based film layers also help improve thermal conductivity of IC devices fabricated according to the method of the present invention thereby improving heat transfer out of the IC.

For a further understanding of the objects and advantages of the present invention, reference should be made to the ensuing detailed description taken in conjunction with the accompanying drawings.

DETAILED DESCRIPTION OF THE PREFERRED EMBODIMENTS

I. Introduction

The present invention allows deposition of an insulating layer having a low dielectric constant (in some embodiments, between approximately 2 and 3) and desirable gap fill characteristics. The insulating layer of the present invention is deposited using low temperatures in CVD chambers of conventional design.

II. Exemplary CVD System for the Deposition of Carbon Film

The present invention is applicable to substrate processing equipment such as electron cyclotron resonance (ECR) plasma CVD devices, thermal CVD devices, etch devices and sputter deposition devices, among others. One such substrate processing system is the HDP-CVD system illustrated in FIG. 1 and described below. In a currently preferred embodiment of the present invention, a HDP-CVD system is employed to deposit one or more layers of carbon-based film to provide a low dielectric constant insulating layer as described in more detail below. In other embodiments, conventional PECVD and other techniques may also be used to deposit the carbon layers.

Figure 1:
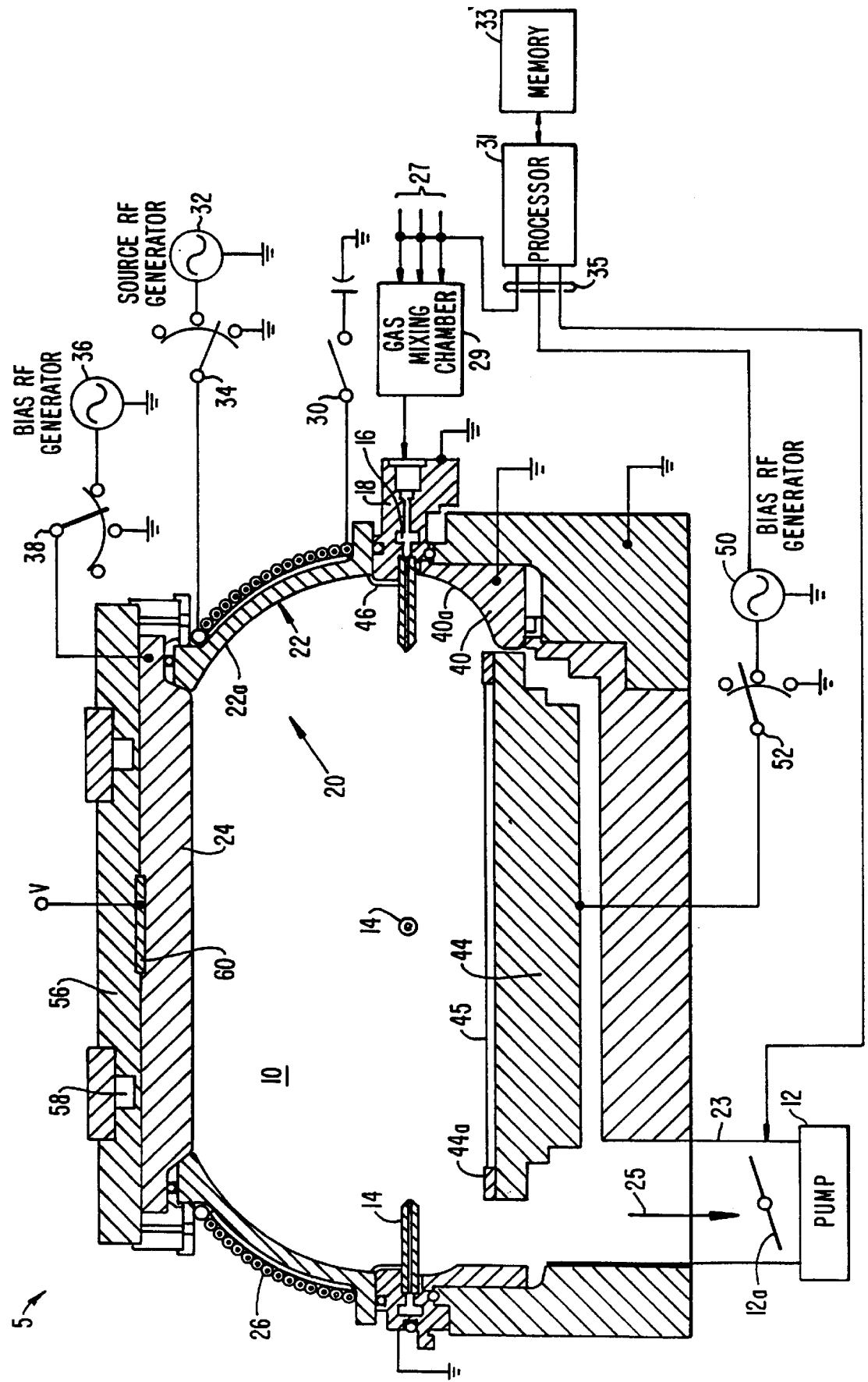
FIG. 1 is a cross-sectional diagram of an exemplary CVD processing chamber used according to an embodiment of the present invention.

As illustrated in FIG. 1, an HDP-CVD system 5 includes a process chamber 10, a vacuum pump 12, a bias RF (BRF) generator 36, a BRF generator 50, and a source RF (SRF) generator 32. Process chamber 10 includes a ceiling 20 consisting of a sidewall 22 and a disk-shaped ceiling electrode 24. Sidewall 22 is made of an insulator such as quartz or ceramic, and supports coiled antenna 26. The structural details of coiled antenna 26 are disclosed in U.S. Pat. No. 5,614,055 entitled "High Density Plasma CVD and Etching Reactor," by Fairbain and Nowak, filed Aug. 27, 1993, the disclosure of which is incorporated herein by reference.

Deposition gases and liquids are supplied through lines 27, having control valves (not shown), into a gas mixing chamber 29 where they are combined and sent to a gas supply ring manifold 16. Gas injection nozzles 14 are coupled to gas supply ring manifold 16, and disperse deposition gases introduced into manifold 16 to a substrate 45 resting on a pedestal 44 within chamber 10. Pedestal 44 may contain an electrostatic chuck or similar mechanism to restrain the substrate during processing, and may also contain cooling passages and other features.

Gas supply ring manifold 16 is positioned within a housing 18. Housing 18 is protected from reactants by a skirt 46. Skirt 46 is composed of a material, such as quartz, ceramic, silicon, or polysilicon, which is resistant to the reactants used in the HDP-CVD process. The bottom of process chamber 10 may include an annular liner 40, which itself may be removable.

An inductively coupled plasma of the deposition gases can be formed adjacent to substrate 45 by RF energy applied to coiled antenna 26 from SRF generator 32. SRF generator 32 can supply either single or mixed frequency RF power (or other desired variation) to coiled antenna 26 to enhance the decomposition of reactive species introduced into process chamber 10. Deposition gases are exhausted from chamber 10 through exhaust line 23 as indicated by arrow 25. The rate at which gases are released through exhaust line 23 is controlled by throttle valve 12a.

Ceiling electrode 24 is held in place by a lid 56. Lid 56 is cooled by cooling jackets 58, but ceiling electrode 24 can be heated by a resistive heater 60 to accelerate cleaning rates or alter process parameters. Ceiling electrode 24 is a conductor and may be connected to either ground, to a BRF generator 36, or left unconnected (allowed to float), by properly setting switch 38. Similarly, pedestal 44 may be connected to either ground, to a BRF generator 50, or left unconnected (allowed to float), by properly setting switch 52. The settings of these switches depend upon the plasma's desired characteristics. BRF generators 36 and 50 can supply either single or mixed frequency RF power (or other desired variation). BRF generators 36 and 50 may be separate RF generators, or may be a single RF generator connected to both ceiling electrode 24 and pedestal 44. Application of RF energy from BRF generators 36 and 50 to bias an inductively coupled plasma toward pedestal 44 promotes sputtering and enhances existing sputtering effects of the plasma (i.e., increases the gap-fill capability of a film).

Capacitive coupling may also be used to form the plasma separately from, or in conjunction with, the formation of an inductively coupled plasma. A capacitively coupled plasma may be formed between ceiling electrode 24 and pedestal 44. In this configuration, ceiling electrode 24 and pedestal 44 each act as one plate of a parallel-plate capacitor. The capacitively coupled plasma is formed between these two plates.

BRF generators 36 and 50, SRF generator 32, throttle valve 12a, gas mixing chamber 28, the control valves connected to lines 27, switches 30, 34, 38 and 52, and other elements in HDP-CVD system 5 are all controlled by a system controller 31 over control lines 35, only some of which are shown. System controller 31 operates under the control of a computer program stored in a computer-readable medium such as a memory 33. The computer program dictates the timing, mixture of gases, chamber pressure, RF power levels, and other parameters of a particular process.

Process chamber 10 may also include analog assemblies such as mass flow controllers (MFCs) that are controlled by system controller 31 that executes system control software stored in a memory 33, which, in the preferred embodiment is a hard disk drive. Motors and optical sensors are used to move and determine the position of movable mechanical assemblies such as throttle valve 12a.

An example of such an HDP-CVD apparatus, along with the details of each of the capacitively coupled configurations and the specific details concerning the inductively coupled configurations, is described in U.S. patent application Ser. No. 08/234,746 entitled "High Density Plasma CVD Reactor with Combined Inductive and Capacitive Coupling," filed Apr. 26, 1994, the disclosure of which is incorporated herein by reference.

The above description is for illustrative purposes only and should not be considered as limiting the scope of the present invention. Variations of the above-described system, such as variations in pedestal design, chamber design, location of RF power connections, and other variations are possible.

III. Exemplary Chamber for Deposition of Polymer Layers

In a currently preferred embodiment of the present invention, at least a second processing chamber is employed to deposit layers of polymeric material (e.g., parylene or polytetrafluoroethylene [Teflon™]) on a substrate. Features of the present invention may, however, be implemented in a single chamber to provide in situ deposition of multilayer films.

Figure 2:
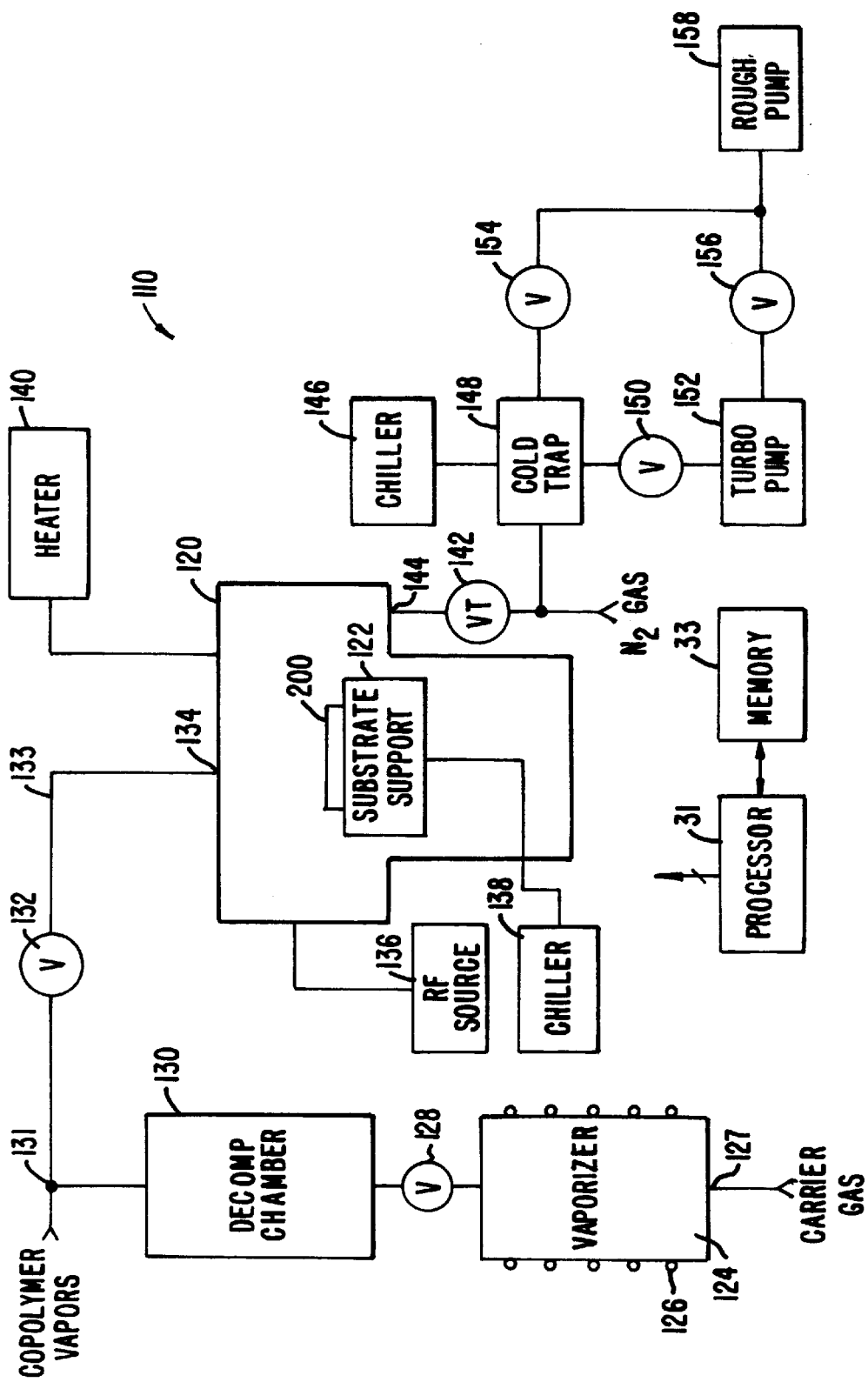
FIG. 2 is a schematic diagram of an organic film processing system used according to an embodiment of the present invention.

In a currently preferred embodiment, a chamber for the deposition of parylene films is used. An organic film processing system 110 in which parylene and other polymer films may be deposited is shown in FIG. 2. This processing system is described in further detail in commonly-assigned, co-pending U.S. application Ser. No. 08/734,978 entitled "Method and Apparatus for Forming a Thin Polymer Layer on an Integrated Circuit Structure" filed Oct. 22, 1996, which is assigned to Applied Materials, Inc, and is hereby incorporated by reference for all purposes.

As used herein, the term "parylene" is the generic name for thermoplastic polymers based on p-xylylene ($CH_2C_6H_4CH_2$) or derivatives of the parylene monomers, polymers, or copolymers. The nonsubstituted p-xylylene polymers have the formula:

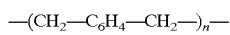

wherein n is sufficient to provide high strength. The polymer grows by addition of monomer on both ends, and the end groups, which are not easily identified, have no influence on properties. The term "parylene" is also intended to cover chlorinated or fluorinated forms of the parylene polymers produced by halogenating the monomers or the polymers. The typical starting material is a stable cyclic dimmer, di-p-xylylene, or halogenated derivative, which is available in solid form. The dimmer must be vaporized or sublimed, and then decomposed to the reactive monomeric for the polymerization to proceed. The dimmer is commercially available from companies such as Union Carbide. Usually the solid dimmer is available in particulate form, e.g., in powder form, for ease of handling. However, it is contemplated by the present invention that dimmer pellets may be used in conjunction with a packed bed, or that the solid precursor material may be liquefied or dissolved in a carrier fluid to facilitate continuous delivery of the dimmer.

Referring to FIG. 2, in one embodiment, an organic film deposition system 110 is provided having a vaporization chamber 124 used to heat and vaporize or sublime a di-p-xylylene or substituted di-p-xylylene. A pressure gauge (not shown), is located in the vaporization chamber to monitor the pressure of the vaporizer and insure that a continuous feed of particulate solid or liquid dimmer is provided to the vaporization chamber 124. Preferably, the pressure gauge is heated so that material will not deposit on the gauge and render the gauge inoperable.

The vaporized dimmer, such as di-p-xylylene, or optional mixture of vaporized dimmer and a carrier gas, then passes from vaporization chamber 124 through a gate valve 128 to a pyrolysis or decomposition chamber 130 where the vaporized dimmer is at least partially decomposed to the reactive monomer, such as mono-p-xylylene. It should be recognized that when the polymerizable material is a monomer or oligomer that does not require vaporization or decomposition to produce a reactive species, then the vaporization and decomposition chambers may be removed or bypassed.

Vaporization chamber 124 heats the starting material to vaporize or sublime a liquid or solid polymerizable material before introducing it into the deposition chamber or blending it with another monomer. Vaporization chamber 124 may be formed around a metal cylinder having a gas inlet port 127 to permit the flow of a non-reactive gas into vaporization chamber 124. An exit port of vaporization chamber 124, is coupled to a gate valve 128 that separates vaporization chamber 124 from decomposition chamber 130. A containment vessel is contained within vaporization chamber 124 for the placement of polymerizable starting material, such as di-p-xylylene.

The pressure in vaporization chamber 124 may be maintained at atmospheric pressure. The entire apparatus (vaporization, decomposition, and deposition chambers) is preferably maintained at the same pressure (e.g., between 30 millitorr to 5 torr). In the absence of an inert carrier gas, the pressure will range from about 100 millitorr to about 1 torr or about 20–60 millitorr above the base pressure, which is preferably in the range of 80–120 millitorr. When a carrier gas is used, the total pressure will range from 1 torr to about 5 torr, preferably 2 to 5 torr. The increase in total pressure increases the deposition rate of the parylene layer and allows better control of the amount of reactive p-xylylene that is provided to the deposition chamber. The carrier gas can be any inert gas, such as helium, argon, or nitrogen, but helium is currently preferred.

Vaporization chamber 124 may be heated by any convenient means such as, for example, an adjustable heating coil 126, which may be wrapped around the vaporization chamber 124 to heat the same. Heating coil 126 is adjustable to provide sufficient heat to vaporization chamber 124 to heat it to the vaporization temperature of the polymerizable material therein, but below a temperature at which the material will decompose into the reactive monomer. An external heat controller, such as a Watlow 965 Temperature Controller, may be used in connection with the heating coil to maintain the desired temperature.

The temperature of vaporization chamber 124, when operated within the previously described pressure ranges, usually will vary from a minimum temperature below which the material will not vaporize, at the pressure required for deposition, up to a maximum temperature below the temperature at which the vaporized material will decompose at the operative pressure. While the operating temperature of the vaporization chamber will vary according to the material to be vaporized, the temperature is preferably maintained between about 100° C. and about 200° C.

Nonreactive carrier gases, such as nitrogen, argon, or helium are optionally introduced into vaporization chamber 124 through gas inlet port 127, and are then heated by the heat radiating or being conducted from vaporization chamber 124 to vaporize the solid parylene dimmer, which then leaves vaporization chamber 124 and passes through gate valve 128 to decomposition chamber 130. However, it should be recognized that the process may be carried out using only the vaporized reactant, e.g. parylene dimmer, without the use of an additional gas such as a carrier gas.

Gate valve 128 may be manually operated, but preferably will be automatically operated and connected to controller such as system controller 31 (FIG. 1), which is programmed to sense the temperature and pressure in vaporization chamber 124 and open valve 128 only after vaporization chamber 124 has reached a temperature at which the polymerizable material will vaporize so that gases flowing from vaporization chamber 124 through gate valve 128 will contain vaporized polymerized material, as well as the optional nonreactive carrier gases flowing through vaporization chamber 124.

When decomposition of the vaporized polymerizable starting material is necessary to form a reactive monomer, such as when using di-p-xylylene, the vapors from the vaporization chamber preferably are sent to a decomposition chamber. Although the decomposition chamber may be constructed in many ways, it is preferred that the chamber have a large surface area to heat the vaporized material rapidly and evenly. In one embodiment, decomposition chamber 130 is coupled at one end to a first gate valve 128, which is used to control the flow of the vapors of the dimmer entering the decomposition chamber 130.

Preferably, system controller 31 is coupled to control heater wires in decomposition chamber 130. System controller 31 controls the temperature of the decomposition chamber to provide a heat between about 400° C. and about 900° C., preferably at least about 700° C. A temperature of at least about 400° C. and preferably at least about 700° C., is necessary to assure sufficient decomposition of the stable dimmer into the reactive monomer, but the maximum temperature should not exceed about 900° C. to avoid decomposition of the monomer formed in decomposition chamber 130. Again should be recognized that the decomposition temperature will vary according to the dimmer material being used.

It is preferred that decomposition chamber 130 decompose a sufficient amount of the dimmer to form the reactive monomer during its passage through the chamber in order to prevent the deposition of unwanted particles on the substrate surface or the formation of lumps in the deposited coating. Dimmer that has not been decomposed will not polymerize, and may, therefore, cause lumps in the coating as its deposits on the substrate, cause unwanted particles on the surface, or pass through the deposition chamber and clog the cold trap mechanism 148 located downstream of deposition chamber 120 ahead of rough vacuum pump 158.

To ensure a high level of decomposition of the stable dimmer vapors, it is preferred that the dimmer vapor be sufficiently heated in decomposition chamber 130. This can be accomplished either by increasing the interior surface area of decomposition chamber 130 in contact with the vaporized dimmer, or by extending the residence time of the vaporized dimmer in decomposition chamber 130, or by a combination of both. Typically, the residence time of the vaporized dimmer in the decomposition chamber is 1–5 minutes. To enhance decomposition of the dimmer to reactive monomer, a plasma may be established in the deposition chamber to provide sufficient heat to decompose any stable precursor material into reactive material for subsequent deposition and polymerization on a substrate.

Extension of the residence time in the decomposition chamber may be provided by regulating the flow rate of vaporized dimmer into decomposition chamber 130, such as by regulating the flow of carrier gas into vaporization chamber 124; or by throttling gate valves 128 and 132; or by a combination of such valve throttling and carrier gas flow rate control. The residence time can also be controlled by modifying the length of the path through decomposition chamber 130.

The gas/vapor flow containing the active monomer then passes out of decomposition chamber 130 to a tee 131 where the vapors optionally are blended with a copolymerization material in vaporized form. The vaporized monomer and optional copolymerizable material then flow through a second gate valve 132 to a conduit 133, which connects valve 132 with an entrance port 134 to a deposition chamber 120 where the monomer deposits and polymerizes on an object therein, such as a semiconductor substrate, which preferably is temperature-controlled by a support member 122 that is connected to a chiller 138. Where further vaporization and/or decomposition of the polymerizable material is not necessary, polymerizable material is introduced at tee 131 for direct communication to the chamber 120 and the vaporization chamber 124 and decomposition chamber 130 may be eliminated. The decomposition chamber 130 will typically be needed when a carrier gas is present.

Tee 131 is preferably heated by an external heater, such as a heating tape wrapped around tee 131, to maintain the reactive monomer at a temperature sufficiently high so that it will not begin to polymerize. Usually this will comprise a temperature of at least about 150° C. When a copolymerizable source is used, a second vaporization chamber, similar to the previously described vaporization chamber 124, can be used to vaporize the copolymerizable material. If necessary, further apparatus forming a decomposition chamber similar to the previously described decomposition chamber 130 may also be used. In either case, the apparatus used to provide such a copolymerizable material in gaseous form may then be connected to tee 131 to thereby permit the respective gaseous reactive copolymerization sources to blend together in tee 131 prior to introduction into deposition chamber 120.

In a further embodiment, other polymerizable gases, such as monomers, dimmers, and other oligimers, etc., may be blended with the gaseous parylene monomer in heated tee 131 if it is desired to form and deposit a copolymer on the surface of the substrate in the deposition chamber. Such other polymerizable materials might include, for example, a vinyl biphenyl monomer, such as available from the Lancaster Synthesis Company. One reason for copolymerizing the reactive parylene monomer with such a monomer is to increase the temperature stability of the film to be formed on the substrate during the deposition from about 400° C. (polymerized parylene alone) up to between about 500° C. and 550° C. for the copolymer. The amount of copolymerized monomer blended with the gaseous flow of parylene reactive monomer and carrier gas may range from about 5% by wt. to about 25% by wt. of the total mixture of monomers, but preferably will range from about 5% by wt. to about 15% by wt., with the typical amount of copolymerizable monomer added usually comprising about 10% by wt. of the monomer mixture total.

Deposition chamber 120 may comprise a standard commercially available vacuum processing chamber, with some modifications as will be described below. Such a vacuum processing chamber is available from Applied Materials, Inc., such as an oxide etch chamber. Chamber 120 may be connected via a load lock mechanism to other vacuum or closed chambers (e.g., the exemplary HDP-CVD chamber described above) in a semiconductor substrate processing apparatus, such as the multichambered 5000 Series processing apparatus available from Applied Materials, Inc. without exposing the substrate to the atmosphere. Such an apparatus is serviced by a central robot and disclosed and described in U.S. Pat. No. 4,951,601, issued to Maydan et al. and assigned to Applied Materials, Inc., the disclosure of which is hereby incorporated by reference.

Figure 3:
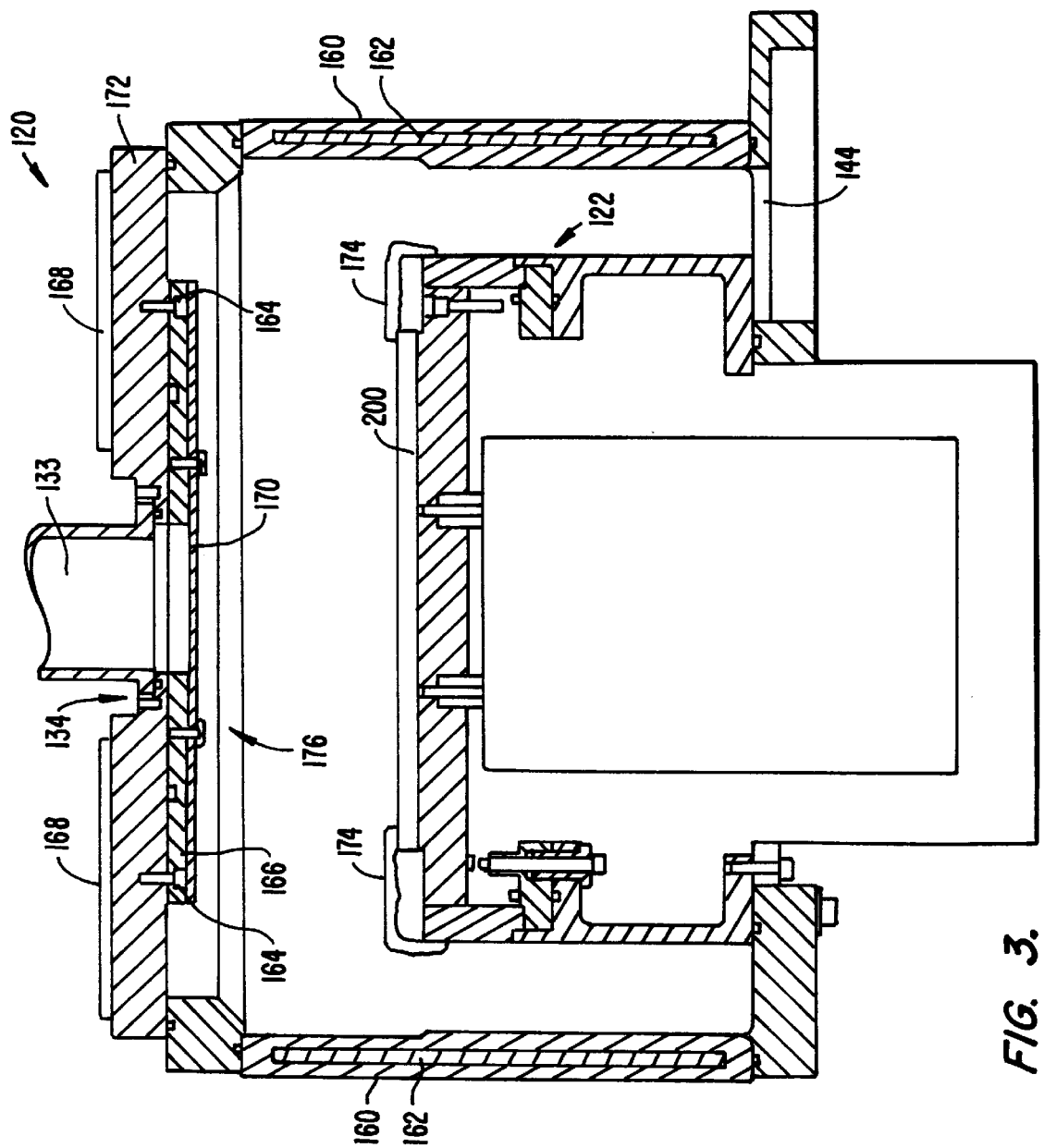
FIG. 3 is a vertical cross-sectional view of the deposition chamber generally shown in FIG. 2.

Referring to FIG. 3, deposition chamber 120 has a removable cover 172 having entrance port 134 to which conduit 133 is secured. Cover 172 is, in turn, bolted to the cylindrical sidewall of chamber 120. Mounted to the underside or inside portion of cover 172, and in communication with conduit 133, is a vapor distribution mechanism or "showerhead" 176 that serves to introduce the gaseous mixture from conduit 133 into chamber 120. Cover 172 may have heater pads 168 mounted on the upper or outer surface thereof to maintain cover 172 and showerhead 176 at a temperature above the polymerization temperature of the reactive parylene monomer, i.e., at a temperature above 200° C., but below a temperature at which further decomposition of the reactive monomer might occur, i.e., at a temperature below about 750° C. Typically, the temperature of cover 172 and showerhead 176 will be maintained within a range of about 200° C. to about 300° C. Such heater pads may also be connected to a temperature controller to maintain the temperature of cover 172 and showerhead 176 at the desired temperature.

It is preferred that the walls of deposition chamber 120 be maintained at a sufficiently high temperature to prevent deposition and polymerization of the vaporized polymerizable material. In one embodiment, the chamber wall temperature is maintained by a heater 140 (FIG. 2), which preferably is controlled by system controller 31. The remaining gas/vapor mixture then passes from deposition chamber 120 through a throttle valve 142, also preferably controlled by system controller 31, which regulates the pressure in chamber 120, and then passes through a cold trap 148 connected to a chiller 146. The remaining gases then pass through a gate valve 154 to a rough pump 158.

When it is desired to use chamber 120 for etching or when in situ cleaning of chamber 120 is performed, the gases from optional cold trap 148 may instead be routed through gate valve 150 (with gate valve 154 shut off) to turbo pump 152 and then through isolation valve 156 to rough pump 158. During deposition in chamber 120, valves 150 and 156 are typically shut.

In one embodiment, the apparatus may be provided with an RF generator 136, which is coupled to chamber 120 to permit generation of a plasma within chamber 120. The plasma may be used to enhance the decomposition of stable precursors by generating enough heat to convert the stable dimmer into the reactive species. The plasma may also provide sufficient heating of the chamber walls to prevent polymerization thereon, and/or sufficient heating of the process gases to prevent polymerization in the gas phase. In addition, the RF generator enables integration of the chamber so that either of the substrate or in situ cleaning of the chamber 120 can be performed.

It is contemplated that the chamber may include an electric bias to provide an electric field to enhance the deposition rate of the polymerizable material onto the substrate. Preferably, the chamber walls are grounded and a DC bias is applied to the substrate support member 122. In addition to the electric field, a magnetic field may be created in the chamber by placement of magnetic field coils or permanent magnets within or about the walls of the chamber. It is also believed that both the electric field and the magnetic field enhance the deposition rate of the polymerizable material onto the substrate because the reactive polymerizable material may be polarized. It is theorized that the E field and/or the B field assist in the polymerization process by aligning the reactive material so that the polymerization reaction is facilitated.

It should be noted that, in accordance with the invention, the substrate 200 is preferably processed in a closed system. Thus, after the deposition, the substrate may be removed from deposition chamber 120, placed in a storage area in a load lock chamber between processing chambers, and allowed to reach ambient temperature. This permits the substrate to reach ambient temperature without either exposing the substrate to the ambient atmosphere during the warm-up (which would result in unacceptable moisture pickup), or leaving the coated substrate in the deposition chamber to warm up (which would reduce the throughput rate in the parylene deposition chamber). Alternatively, the substrate may be moved from the load lock chamber to other chambers for subsequent processing without removing the substrate from the vacuum environment, e.g., moved to another chamber for PECVD formation of a carbon-based and/or silicon dioxide film thereon.

The vapors/gases provided to deposition chamber 120 may be distributed through a variety of manifold and nozzle arrangements as disclosed in U.S. application Ser. No. 08/734,978 entitled "Method and Apparatus for Forming a Thin Polymer Layer on an Integrated Circuit Structure" previously mentioned.

Referring now to substrate support member 122, the movable substrate support member should be sufficiently cooled to obtain a substrate temperature below the condensation temperature of the polymerizable material. Where the desired polymer to be formed on the substrate is parylene, the substrate support 122 should be maintained at a temperature not exceeding about 40° C., and preferably within a range of about −40° C. to about +25° C., using chiller 138. When the gaseous mixture contacts the cooled surface of, for example, semiconductor substrate 200, polymerization of the reactive parylene monomers commences, as. well as copolymerization with other reactive polymerization materials (if present), resulting in the formation of the desired dielectric film of parylene or parylene copolymer on the surface of the substrate, e.g., on the surface of semiconductor wafer 200.

A temperature control system may be provided to cool substrate support 122, or support 122 may be provided with a hollow passageway through which a fluid may be circulated, for example, from chiller 138, either of which may be controlled by system controller 31, to control the temperature of substrate support 122 and a substrate mounted thereon, such as semiconductor wafer 200. The substrate may be retained on substrate support 122 by any conventional substrate retention means such as a bipolar or monopolar electrostatic chuck or by clamping means. A backside gas such as helium is preferably flown through channels provided in the upper surface of the electrostatic chuck to facilitate heat transfer between the substrate support member and a substrate located thereon for processing.

After the mixture of vaporized gases and optional carrier gases flow into chamber 120, a parylene polymer, for example, is deposited on the surface of substrate 200 by condensation and polymerization of the reactive p-xylylene monomers. The remainder of the optional carrier gases, and unreacted monomer vapors, then pass out of the chamber 120 and through a throttle valve 142 to a cold trap 148. The purpose of throttle valve 142 is to maintain the desired pressure within chamber 120. The deposition/polymerization reaction is usually carried out while maintaining a pressure within deposition chamber 120 of about 30 millitorr to about 1 torr in the absence of a carrier gas. A pressure lower than about 30 millitorr will result in little or no deposition of the parylene on the substrate, while too high a pressure, i.e., a pressure above about 1 torr, will result in deposition of a low crystalline film, including unreacted polymer. When a carrier gas is present, the pressure within the deposition chamber 120 preferably ranges from 1 torr to 5 torr. When the pressure in deposition chamber 120 deviates from the set pressure, throttle valve 142, which is connected to a pressure sensor, either opens to cause the pressure to drop, or closes to cause the pressure to rise.

Throttle valve 142 may be modified, if desired, to permit a nonreactive gas, e.g., argon, helium, or nitrogen, to be added to the gaseous stream flowing from chamber 120 through throttle valve 142 to cold trap 148. Typically, this additional gas flow into cold trap 148 will comprise a flow of about 50 standard cubic centimeters per minute (sccm), depending on the chamber volume. The purpose of the added non-reactive gases is to control and slow down the flow of the gaseous stream of carrier gas and reactive monomer through deposition chamber 120, i.e., to increase the residence time, to permit more complete extraction of the heat from the gaseous stream through chamber 120, and to provide for more complete reaction of the polymerization, i.e., to further minimize the amount of unreacted polymerizable material leaving chamber 120 that must be extracted in cold trap 148.

The vapors and gases passing through throttle valve 142 then enter cold trap 148, which, in turn, is connected to a turbo vacuum pump 152, which is capable of maintaining chamber 120 at subatmospheric pressure. It is important, however, that unreacted parylene and other copolymerizable materials not enter vacuum pump 152, but rather be removed from the gas stream in cold trap 148. Cold trap 148 may comprise any conventional commercial cold trap, such as, for example, a standard Norcal cold trap, which is connected to the downstream side of throttle valve 142 to trap and remove any such vapors or solids of parylene and other copolymerizable materials from the gas stream.

To clean the chamber following deposition of reactive monomer, ozone is flowed into the chamber at a rate of 1000 sccm. It is believed that ozone reacts with carbon in the parylene film to form $CO_2$ and facilitate removal of the parylene from the chamber. In addition to ozone, oxygen ($O_2$) can be introduced into the chamber at a rate of 100–1000 sccm and an RF bias of 750–1200 Watts applied to the support member to effect cleaning of the chamber. It is believed that the oxygen reacts with the parylene in a manner similar to the reaction of ozone with parylene. It is also possible to clean the chamber with a fluorine gas such as $NF_3$, $C_2F_6$, or others. For a fluorine clean it is believed that the fluorine reacts with hydrogen in the parylene film to form HF and facilitate removal of the parylene film from the chamber.

The above description is for illustrative purposes only and should not be considered as limiting the scope of the present invention. Variations of the above-described system, such as variations in pedestal design, chamber design, location of RF power connections and other variations are possible. Gas flow rates are given assuming a chamber volume designed to accommodate an 8-inch diameter wafer and will vary for differing chamber volumes.

IV. Computer Control of the Processing Systems

In one specific embodiment, a common system controller 31 controls all of the activities of the both the CVD machine 10 and the organic film deposition system 60, although those skilled in the art will recognize that individual system controllers may be used; one for CVD machine 10, and one for organic film deposition system 60.

In a preferred embodiment, controller 31 includes a hard disk drive, a floppy disk drive, and a card rack. The card rack contains a single board computer (SBC), analog and digital input/output boards, interface boards, and stepper motor controller boards. The system controller conforms to the Versa Modular European (VME) standard that defines board, card cage, and connector dimensions and types. The VME also defines the bus structure as having a 16-bit data bus and 24-bit address bus.

Figure 4:
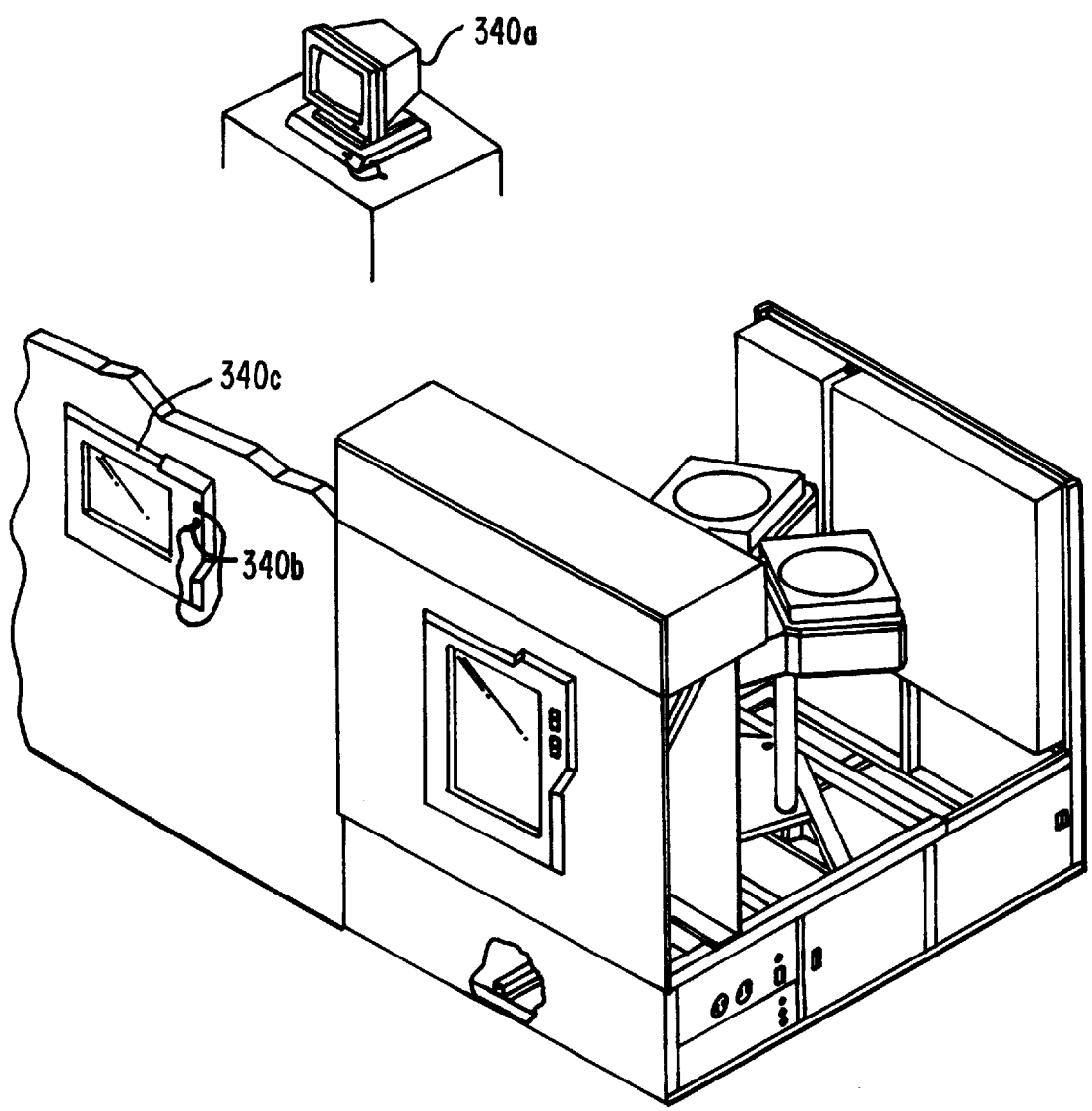
FIG. 4 is a diagram of an exemplary system monitor used in conjunction with the processing systems of FIGS. 1 and 2.

System controller 31 operates under the control of a computer program stored on the hard disk drive. The computer program dictates the timing, mixture of gases, RF power levels and other parameters of a particular process. The interface between a user and the system controller, as depicted in FIG. 4, is via a CRT monitor 340a and a light pen 340b. In the preferred embodiment two monitors 340a are used, one mounted in the clean room wall for the operators and the other behind the wall for the service technicians. Both monitors 340a simultaneously display the same information, but only one light pen 340b is enabled. Light pen 340b detects light emitted by CRT display with a light sensor in the tip of the pen. To select a particular screen or function, the operator touches a designated area of the display screen and pushes the button on pen 340b. The touched area changes its highlighted color, or a new menu or screen is displayed, confirming communication between the light pen and the display screen.

The process can be implemented using a computer program product 141 that runs on, for example, system controller 31. The computer program code can be written in any conventional computer-readable programming language, such as, for example, 68000 assembly language, C, C++, or Pascal. Suitable program code is entered into a single file, or multiple files, using a conventional text editor, and stored or embodied in a computer-usable medium, such as a memory system of the computer. If the entered code text is in a high level language, the code is compiled, and the resultant compiler code is then linked with an object code of precompiled Windows™ library routines. To execute the linked compiled object code, the system user invokes the object code, causing the computer system to load the code in memory, from which the CPU reads and executes the code to perform the tasks identified in the program.

Figure 5:
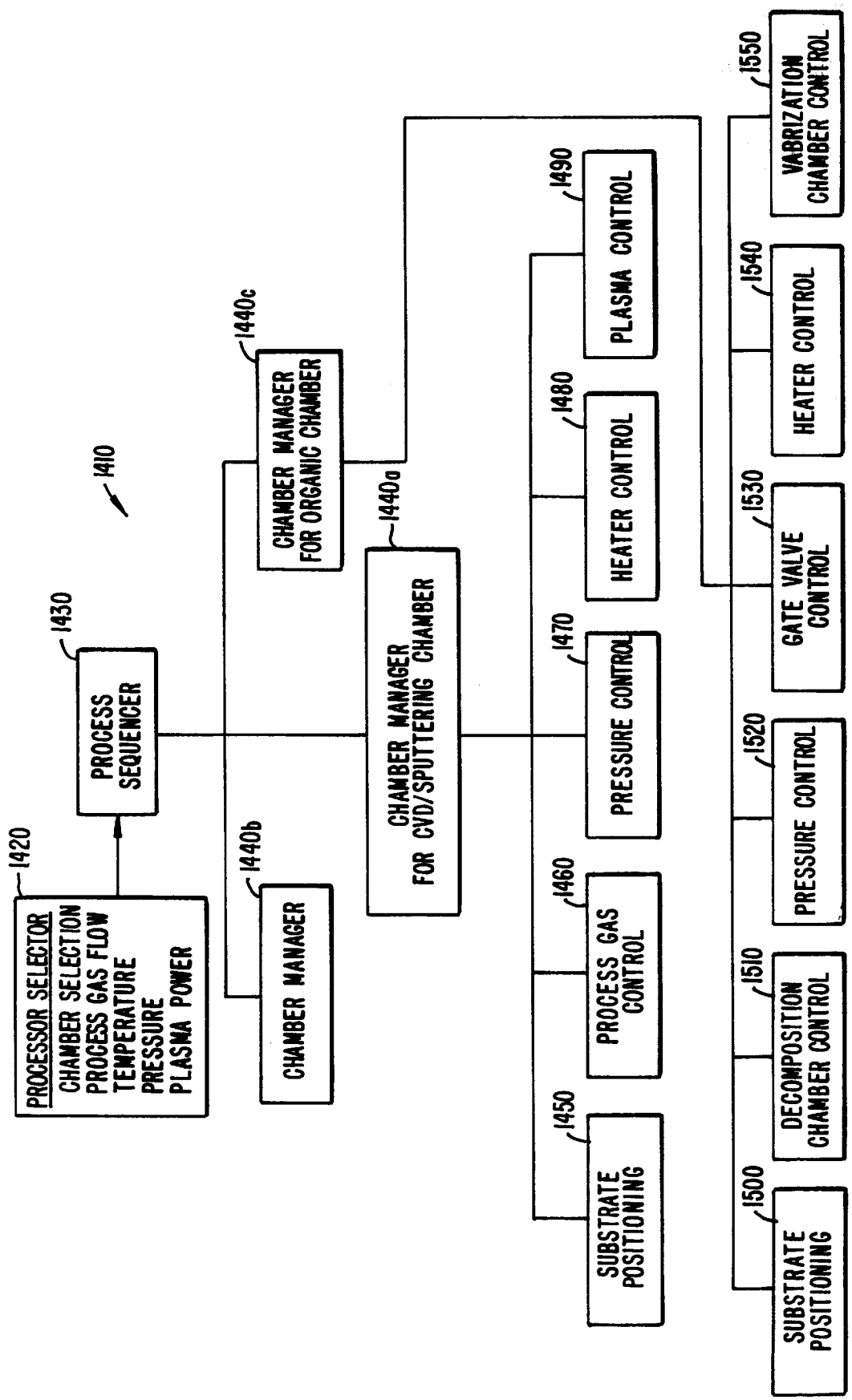
FIG. 5 is a flow chart of an exemplary process control computer program product used to control the processing systems of FIGS. 1 and 2.

FIG. 5 shows an illustrative block diagram of the hierarchical control structure of computer program 1410. A user enters a process set number and process chamber number into a process selector subroutine 1420 in response to menus or screens displayed on the CRT monitor by using the light pen interface. The process sets are predetermined sets of process parameters necessary to carry out specified processes, and are identified by predefined set numbers. The process selector subroutine 1420 identifies (i) the desired process chamber, and (ii) the desired set of process parameters needed to operate the process chamber for performing the desired process. The process parameters for performing a specific process relate to process conditions, such as, for example, process gas composition and flow rates, temperature, pressure, plasma conditions such as RF bias power levels and magnetic field power levels, cooling gas pressure, and chamber wall temperature. These parameters are provided to the user in the form of a recipe. The parameters specified by the recipe are entered utilizing the light pen/CRT monitor interface.

The signals for monitoring the process are provided by the analog input and digital input boards of system controller, and the signals for controlling the process are output on the analog output and digital output boards of system controller 31.

A process sequencer subroutine 1430 comprises program code for accepting the identified process chamber and set of process parameters from the process selector subroutine 1420, and for controlling operation of the various process chambers. Since multiple users can enter process set numbers and process chamber numbers, or a single user can enter multiple process set numbers and process chamber numbers, sequencer subroutine 1430 operates to schedule the selected processes in the desired sequence. Preferably, sequencer subroutine 1430 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 1430 can be designed to take into consideration the present condition of the process chamber being used in comparison with the desired process conditions for a selected process, or the "age" of each particular user entered request, or any other relevant factor a system programmer desires to include for determining scheduling priorities.

After sequencer subroutine 1430 determines which process chamber and process set combination is going to be executed next, sequencer subroutine 1430 causes execution of the process set by passing the particular process set parameters to a chamber manager subroutine 1440a–c which controls multiple processing tasks in process chamber 10 according to the process set determined by sequencer subroutine 1430. For example, chamber manager subroutine 1440a comprises program code for controlling sputtering and CVD process operations in process chamber 10, whereas chamber manager subroutine 1440c comprises program code for controlling operation of organic film processing system 110. Chamber manager subroutine 1440 also controls execution of various chamber component subroutines that control operation of the chamber components necessary to carry out the selected process set.

Examples of chamber component subroutines for control of chamber 10 are substrate positioning subroutine 1450, process gas control subroutine 1460, pressure control subroutine 1470, heater control subroutine 1480, and plasma control subroutine 1490. Those having ordinary skill in the art will recognize that other chamber control subroutines can be included depending on what processes are desired to be performed in process chamber 10. In operation, chamber manager subroutine 1440a selectively schedules or calls the process component subroutines in accordance with the particular process set being executed. Scheduling by chamber manager subroutine 1440a is performed in a manner similar to that used by sequencer subroutine 1430 in scheduling which process chamber 10 and process set is to be executed. Typically, chamber manager subroutine 1440a includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIG. 5. Substrate positioning subroutine 1450 comprises program code for controlling chamber components that are used to load a substrate onto pedestal 44. Substrate positioning subroutine 1450 may also control transfer of a substrate into chamber 10 from, e.g., organic film processing system 110 after an organic layer has been deposited.

Process gas control subroutine 1460 has program code for controlling process gas composition and flow rates. Subroutine 1460 controls the open/close position of the safety shut-off valves, and also ramps up/down the mass flow controllers to obtain the desired gas flow rate. All chamber component subroutines, including process gas control subroutine 1460, are invoked by chamber manager subroutine 1440a. Subroutine 1460 receives process parameters from the chamber manager subroutine related to the desired gas flow rates. Typically, process gas control subroutine 1460 operates by opening the gas supply lines, and repeatedly (i) reading the necessary mass flow controllers, (ii) comparing the readings to the desired flow rates received from chamber manager subroutine 1440a, and (iii) adjusting the flow rates of the gas supply lines as necessary. Furthermore, process gas control subroutine 1460 includes steps for monitoring the gas flow rates for unsafe rates, and activating the safety shut-off valves when an unsafe condition is detected.

In some processes, an inert gas such as argon is flowed into chamber 10 to stabilize the pressure in the chamber before reactive process gases are introduced into the chamber. For these processes, the process gas control subroutine 1460 is programmed to include steps for flowing the inert gas into chamber 10 for an amount of time necessary to stabilize the pressure in the chamber. The above-described steps may then be carried out. Additionally, when a process gas is to be vaporized from a liquid precursor, for example, TEOS, the process gas control subroutine 1460 includes steps for bubbling a delivery gas such as helium through the liquid precursor in a bubbler assembly. For this type of process, the process gas control subroutine 1460 regulates the flow of the delivery gas, the pressure in the bubbler, and the bubbler temperature to obtain the desired process gas flow rates. As discussed above, the desired process gas flow rates are transferred to process gas control subroutine 1460 as process parameters. Furthermore, the process gas control subroutine 1460 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

Pressure control subroutine 1470 includes program code for controlling the pressure in chamber 10 by regulating the size of the opening of throttle valve 12a in the exhaust portion of the chamber. The size of the opening of throttle valve 12a is set to control the chamber pressure to the desired level in relation to the total process gas flow, size of the process chamber, and pumping set point pressure for the exhaust system. When pressure control subroutine 1470 is invoked, the desired, or target, pressure level is received as a parameter from chamber manager subroutine 1440a. Pressure control subroutine 1470 operates to measure the pressure in chamber 10 by reading one or more conventional pressure nanometers connected to the chamber, compare the measure value(s) to the target pressure, obtain proportional, integral, and differential (PID) values from a stored pressure table corresponding to the target pressure, and adjust the throttle valve 12a according to the PID values obtained from the pressure table. Alternatively, pressure control subroutine 1470 can be written to open or close throttle valve 12a to a particular opening size to regulate chamber 10 to attain a desired pressure.

Heater control subroutine 1480 comprises program code for controlling the temperature of chamber 10. Heater control subroutine 1480 also is invoked by chamber manager subroutine 1440a and receives a target, or set point, temperature parameter. Heater control subroutine 1480 measures the temperature by measuring voltage output of a thermocouple located in pedestal 44, compares the measured temperature to the set point temperature, and increases or decreases current applied to the resistive heating element 60 (or to BRF generators 30, 50 as needed) to obtain the set point temperature. The temperature is obtained from the measured voltage by looking up the corresponding temperature in a stored conversion table, or by calculating the temperature using a fourth-order polynomial.

Plasma control subroutine 1490 comprises program code for setting the RF voltage power level applied to RF generators 32, 36 and 50 in chamber 10, and optionally, to set the level of the magnetic field generated in the chamber. The plasma control subroutine 1490, like the previously described chamber component subroutines, is invoked by chamber manager subroutine 1440a.

Examples of chamber component subroutines for control of organic film processing system 110 are substrate positioning subroutine 1500, decomposition chamber control subroutine 1510, pressure control subroutine 1520, gate valve control subroutine 1530, heater control subroutine 1540, and vaporization chamber control subroutine 1550. Those having ordinary skill in the art will recognize that other chamber control subroutines can be included depending on what processes are desired to be performed in organic film processing system 110. In operation, chamber manager subroutine 1440c selectively schedules or calls the process component subroutines in accordance with the particular process set being executed. Scheduling and control by chamber manager subroutine 1440c is performed in a manner similar to that used by chamber manager subroutine 1440a described above.

For example, substrate positioning subroutine 1500 functions similar to substrate positioning subroutine 1450 described above, and may be used to control movement of a substrate to and from processing chamber 120. Decomposition chamber control subroutine 1510 and vaporization chamber control subroutine 1550 have program code for controlling the decomposition and vaporization of organic material to be deposited. These control subroutines operate in conjunction with the pressure control subroutine 1520, the gate valve control subroutine 1530, and the heater control subroutine 1540 to decompose a sufficient amount of dimmer, form a reactive monomer, and deposit a film on a substrate.

V. Exemplary Structure

Figure 6:
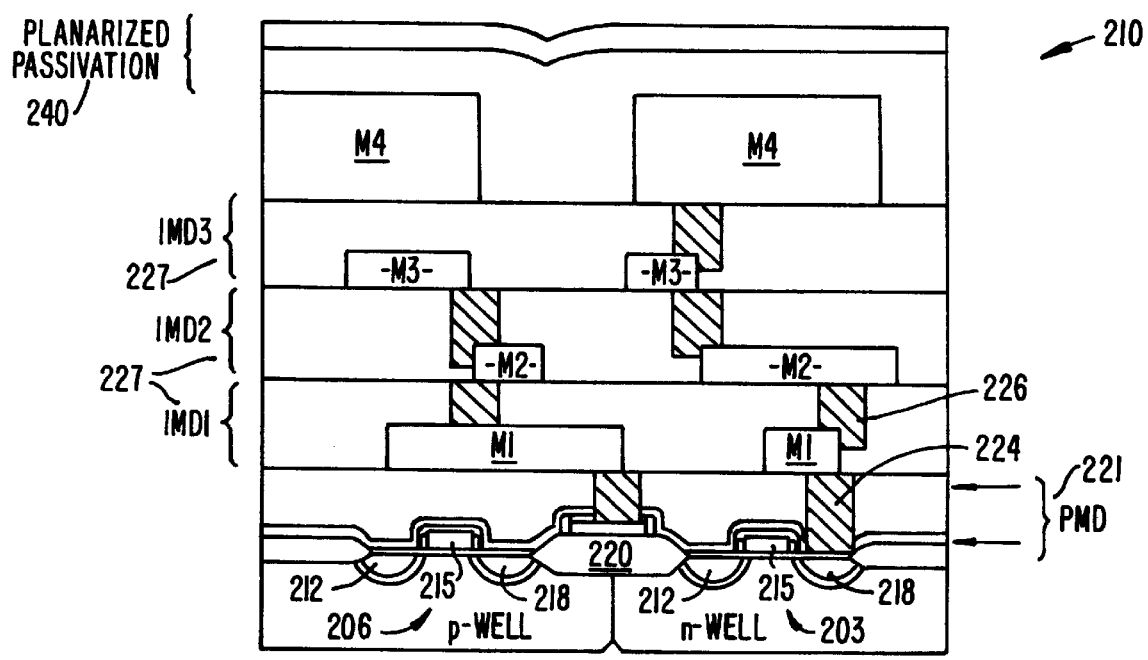
FIG. 6 is a simplified cross-sectional view of an integrated circuit according to the present invention.

FIG. 6 illustrates a simplified cross-sectional view of an integrated circuit 210 incorporating features of the present invention. As shown in FIG. 6, integrated circuit 210 includes NMOS and PMOS transistors 203 and 206, which are separated and electrically isolated from each other by a field oxide region 220. Each transistor 203 and 206 comprises a source region 212, a gate region 215, and a drain region 218.

A premetal dielectric layer 221 separates transistors 203 and 206 from metal layer M1, with connections between metal layer M1 and the transistors made by contacts 224. Metal layer M1 is one of four metal layers, M1–M4, included in integrated circuit 210. Each metal layer M1–M4 is separated from adjacent metal layers by respective intermetal dielectric layers 227 (IMD1, IMD2 and IMD3). Adjacent metal layers are connected at selected openings by vias 226. Deposited over metal layer M4 are planarized passivation layers 240. Passivation layer 240 may be constructed in a similar manner as IMD layers 227.

Embodiments of the present invention may find uses in each of the dielectric layers shown in integrated circuit 210. It should be understood that the simplified integrated circuit 210 is for illustrative purposes only. One of ordinary skill in the art could implement the present method for fabrication of other integrated circuits such as microprocessors, application-specific integrated circuits (ASICS), memory devices, and the like. Additionally, the method of the present invention may be used in the fabrication of integrated circuits using other technologies such as BiCMOS, NMOS, bipolar and others.

VI. Insulating Films Formed With Alternating Carbon and Polymer Layers

Figure 7A:
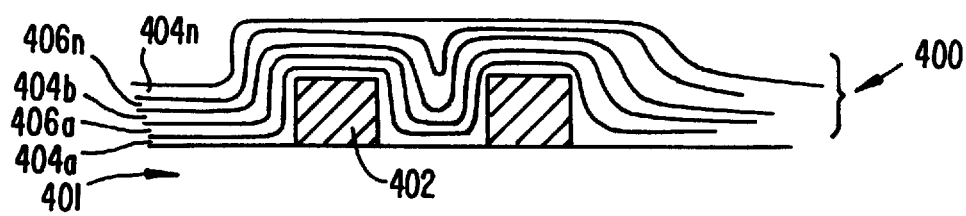
FIG. 7A is a simplified cross-sectional view of an insulating film deposited according to one embodiment of the present invention.

Referring now to FIG. 7A, an insulating film 400 formed according to an embodiment of the present invention is shown. Insulating film 400, which may be used in any of the dielectric layers of circuit 210, includes a number of carbon-based layers 404a–n interspersed with a number of organic polymer layers, such as films in the parylene family or Teflon™ layers (hereinafter collectively referred to as "polymer" layers) 406a–n, all deposited over a stepped topography on a substrate 401 including a metal layer 402. The carbon-based layers and the polymer layers are formed and deposited in a manner to reduce the overall dielectric constant of the insulating film 400 and to provide desirable gap-fill characteristics. Insulating film 400, when formed according to embodiments of the present invention, exhibits a dielectric constant of between about 2 to 3.

Figure 7B:
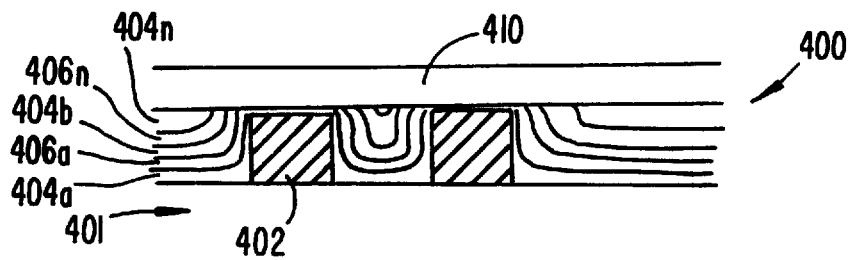
FIG. 7B is a simplified cross-sectional view of an insulating film deposited according to a further embodiment of the present invention.

In one particular embodiment of the present invention, shown by referring to FIG. 7B, the carbon-based layers and polymer layers may be etched or planarized using means known to those skilled in the art (e.g., chemical mechanical polishing) and then covered with a cap layer 410. Alternatively, cap layer 410 may be deposited over insulating film 400 without etching or planarizing.

In the specific embodiment shown, carbon-based layers are shown as the first and last layers. The number of layers may be varied to achieve different gap-fill characteristics and dielectric constants. Most preferably, the first layer deposited over the underlying substrate and metallization layers is a carbon-based layer. Polymer films such as parylene exhibit better stability and gap-fill characteristics when deposited over carbon films (as compared with deposition over $SiO_2$ or metal). Polymer films generally suffer from a number of stability concerns, including structural stability (they are soft and therefore difficult to polish), chemical stability (moisture can degrade the stability of the film), and long term stability during use (electric fields and temperature during device operation can break down organic films). By sandwiching the polymer films between layers of carbon-based film, the instabilities of the polymeric films are minimized. To obtain different film characteristics, the relative thicknesses of each of the layers may also be varied.

In one specific embodiment, carbon-based layers 404a–n are comprised of diamond-like carbon (DLC) material formed from a process gas including sources of carbon and fluorine, such as methane ($CH_4$) and Freon-14, respectively. Other carbon sources may also be used, including acetylene or other hydrocarbons; and other fluorine sources may be used including, for example, $F_2$ or $NF_3$ among others. Also termed "amorphous carbon," "hard carbon," or "α carbon," DLC is a chemically inert amorphous dielectric material with many, but not all, the properties of diamond. DLC films may be deposited using conventional deposition systems, including systems such as the deposition system 10 of FIG. 1.

In a currently preferred embodiment, polymer layers 406a–n are formed from parylene deposited using a deposition system such as the organic film processing system 110 of FIG. 2. However, other polymers, such as Teflon™ may also be used.

Figure 8:
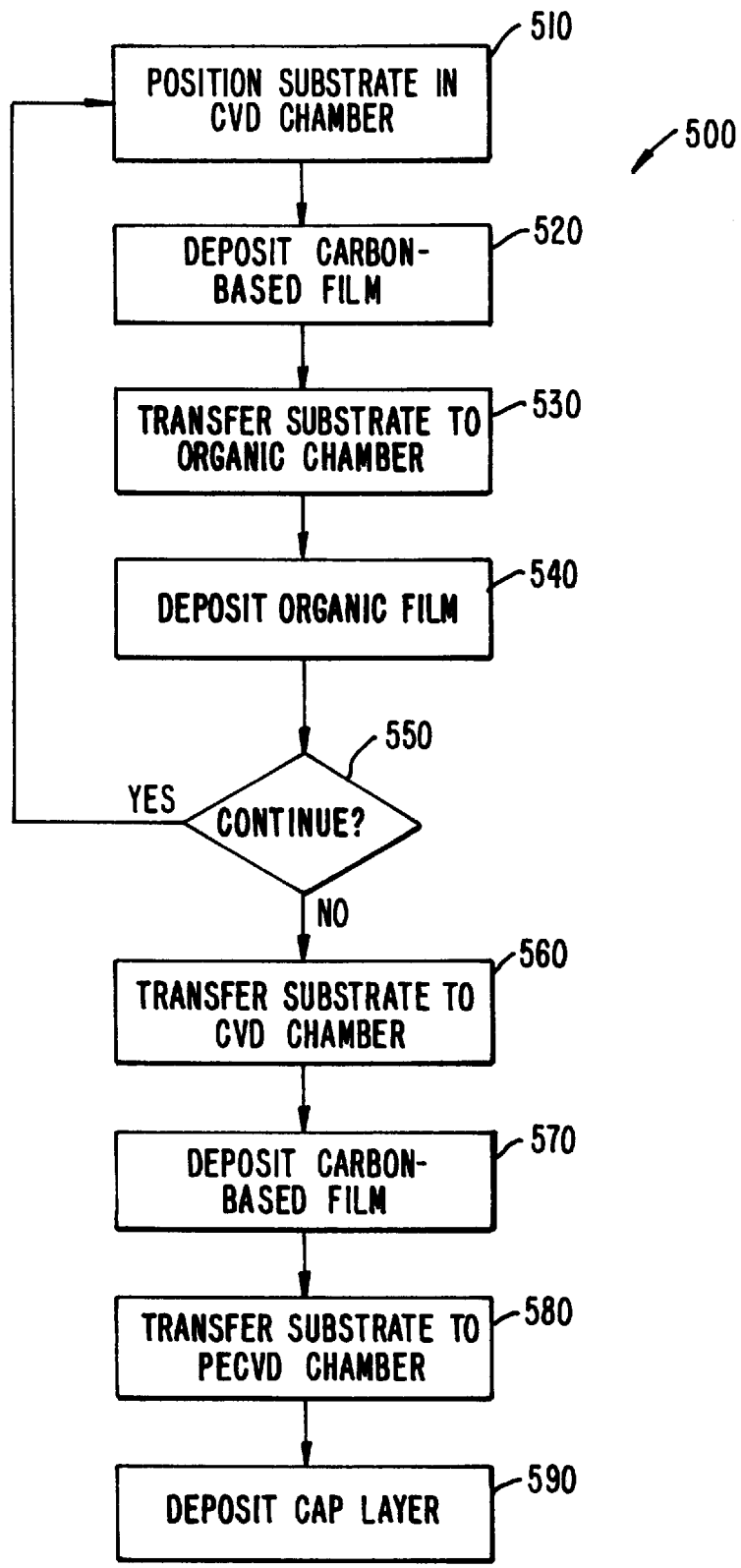
FIG. 8 is a flow chart illustrating the steps performed in applying an insulating film using a process according to the present invention.

Formation of insulating film 400 using embodiments of the present invention will now be described by referring to the flow diagram 500 of FIG. 8. The substrate is first transferred to an HDP-CVD chamber such as process chamber 10 of FIG. 1 (step 510). The substrate is loaded in process chamber 10 through a vacuum-lock door (not shown) and placed onto pedestal 44. Once the substrate is properly positioned, a process gas is introduced into process chamber 10 from gas injection nozzles 14 to begin the deposition of a carbon-based film on the substrate (step 520). The process gas is a mixture comprising a gaseous source of carbon and a gaseous source of fluorine. Additionally, the process gas may include a gaseous source of a heavy inert gas to enhance sputtering during deposition.

In a preferred embodiment, the gaseous mixture consists of a carbon-containing gas such as methane, a fluorine-containing gas such as Freon-14, and argon or a similar gas as an additional constituent. Preferably, the methane and Freon-14 are introduced into process chamber 10 in a mixture containing 60–80% methane and 20–40% Freon-14. Argon is introduced at a rate of about 10 to 50 sccm, and most preferably at a rate of about 20 sccm. The relative quantities of carbon and fluorine may be varied to attain different film characteristics.

A selected pressure between about 1 millitorr to 10 torr (preferably about 5 millitorr to 8 torr) in process chamber 10 is maintained throughout deposition by throttle valve 12a in conjunction with vacuum pump 12, and the introduction of the process gas. Also, by controlling the temperature of the chamber walls, the temperature of the wafer within chamber 10 is maintained between 0–500° C. (preferably between about room temperature to 250° C.).

After processing conditions are set, RF energy is applied to coiled antenna 26 by SRF generator 32 to form an inductive plasma. SRF generator 32 continues to apply RF energy to coiled antenna 26 throughout this process. SRF generator 32 is driven at a frequency of 2 Mhz at about 15–4500 W, but preferably at least 2000 W. For an HDP-CVD chamber adapted for the processing of 8-inch wafers, it is preferable that the SRF generator should be operated to produce a power density of approximately 40 W/in.$^2$ or more. Maintaining the plasma for a selected period under these conditions results in the deposition of a carbon-based layer.

Preferably, during deposition of carbon-based layers 404a–n, the plasma is biased toward the substrate and is further excited by capacitively coupling RF energy from BRF generator 50 to pedestal 44. Preferably, the plasma is biased toward the substrate by applying a negative DC voltage between 10 to 1500 V. The increased ion bombardment toward pedestal 44 enhances sputtering, thereby allowing the growing film to better fill closely spaced gaps. Other frequencies and power levels may also be used to bias the plasma toward the substrate. Applying a negative bias voltage to the substrate also operates to produce high quality carbon-based film.

Once a carbon-based layer has been deposited, the substrate is transferred to organic chamber 110 of FIG. 2 (step 530) and placed on substrate support 122. Substrate support 122 is maintained at a temperature of about 10° C. by chiller 138. Particulate di-p-xylylene is loaded into vaporizer 124 and is heated to a temperature of approximately 150° C. using heating coils 126. Gate valve 128 is then opened to allow vapors from the dimmer in the vaporizer 124 to pass into decomposition chamber 130. Decomposition chamber 130 is maintained at a temperature of approximately 600° C. Gate valve 132 is opened to allow the vaporized reactive p-xylylene to flow into deposition chamber 120. Lid 172 of deposition chamber 120 is maintained at a temperature of about 150° C. while the walls 160 (FIG. 3) are maintained at about 100° C. Approximately 50 sccm of $N_2$ gas (for a chamber volume accommodating an 8-inch wafer) is then flowed into cold trap 148 during deposition, and throttle valve 142 is controlled to maintain a chamber pressure of approximately 50 millitorr. The reactive p-xylylene monomer vapors contact the cooled substrate 200 and polymerize thereon. These process conditions are maintained to deposit a parylene film of a desired thickness (step 540).

Upon completion of deposition of the polymer film on substrate 200, further layers of carbon and polymer films may be deposited as needed (step 550). If more are needed, steps 510–540 are repeated as described above. Preferably, the relative amounts of fluorine and carbon in the carbon-based layers are varied to attain stability and an overall low dielectric constant. In one specific embodiment, layer 404a is formed substantially without fluorine and is 100 Å thick. This produces a thin layer over the substrate 401 that provides a stable base for the subsequent deposition of polymer layer 406a. Layers 404b–n are formed with a higher percentage of fluorine to reduce the dielectric constant of the film. The top carbon-based layers may be formed with a higher percentage of carbon to increase the thermal conductivity of the film.

A lower dielectric constant film is produced by increasing the percentage of fluorine used in the process gas, whereas film stability is increased by decreasing the amount of fluorine used. In a currently-preferred embodiment, each of the carbon-based layers 404a–n are formed with differing relative quantities of carbon and fluorine. Preferably, the lower layer (e.g., layer 404a) is formed with the highest percentage of a carbon source, e.g., 80–100% methane and 0–20% Freon-14 (this has been found to produce a film having greater stability), while the upper layers are formed a higher percentage of a fluorine source, e.g., approximately 60–80% methane and 20–40% Freon-14 (this has been found to produce a film having a lower dielectric constant).

Other carbon sources (including other hydrocarbons such as acetylene) and other fluorine sources may also be used to form the insulating film 400 according to the present invention. Other organic films may also be used. Furthermore, the parameters listed in the above process should not be viewed as limiting the claims as described herein. One of ordinary skill in the art may also use other chemicals, environmental parameters and conditions.

In a preferred embodiment, each parylene layer is sandwiched between carbon-based layers. Thus, in this embodiment, after deposition of the last parylene layer, the substrate is transferred to a CVD chamber (step 560) for deposition of a final carbon-based layer (step 570) in the same manner as described above.

Where necessary or appropriate, a cap layer 410 may be deposited over the insulating film 400. In a currently preferred embodiment, cap layer 410 is an undoped silicon oxide PECVD layer formed in a PECVD chamber such as the chamber described in above-referenced U.S. Pat. No. 5,000,113. Thus, in this embodiment, the substrate is first transferred to the CVD chamber (step 580). The layer is then deposited formed from a process gas including a mixture of, for example, TEOS and oxygen precursor gases or silane and oxygen precursor gases (step 590). While this process gas is introduced into a chamber, temperature, pressure, and other processing conditions are controlled to deposit cap layer 410. In a currently preferred embodiment, cap layer 410 is deposited under a chamber pressure of about 6–12 torr and a chamber temperature of about 360°–440° C. Cap layer 410 is formed using a plasma generated by the application of either single or mixed frequency RF power. When a mixed frequency RF power source is used, a high frequency RF source of 13.56 MHz is driven at about 150–1000 W and preferably at about 600–800 W; and a low frequency RF source of about 200 KHz to 2 MHz is driven at about 50–500 W and preferably at about 50–150 W.

Characteristics of polymeric layers 406*a–n* may be varied by changing their thicknesses. Thicker polymer layers result in a film with a lower dielectric constant. The thickness of each of layers 406*a–n* may be varied as needed to produce a multilayer insulating film having a reduced dielectric constant. The insulating film exhibits good gap-fill characteristics and thermal properties making the film suited for, e.g., IMD applications.

The method of the present invention is not intended to be limited by the specific parameters set forth above. Those of ordinary skill in the art will realize that different processing conditions and different reactant sources can be used without departing from the spirit of the invention. Other equivalent or alternative methods of depositing an insulating layer according to the present invention will be apparent to those skilled in the art. These equivalents and alternatives are intended to be included within the scope of the present invention. Accordingly, it is not intended to limit the invention except as provided in the appended claims.

What is claimed is:

1. A method for forming an insulating film on a substrate, the method comprising steps of:
   forming a diamond like compound (DLC) film on said substrate;
   forming a polymer film on said DLC film; and
   forming a fluorinated DLC film on said polymer film, with said polymer film abutting both said DLC film and said fluorinated DLC film.

2. The method of claim 1 wherein said step of forming said DLC film and said step of forming said fluorinated DLC film further comprises the steps of:
   introducing a process gas into a chamber, said process gas including a gaseous source of carbon and a gaseous source of fluorine; and
   forming a plasma from said process gas by applying a first RF power component.

3. The method of claim 2 wherein said step of forming said DLC film and said step of forming said fluorinated DLC film further comprises the step of:
   biasing said plasma toward said substrate to promote a sputtering effect of said plasma.

4. The method of claim 2 wherein said gaseous source of carbon is methane ($CH_4$).

5. The method of claim 2 wherein said gaseous source of carbon is a hydrocarbon.

6. The method of claim 2 wherein said gaseous source of fluorine is $CF_4$.

7. The method of claim 2 further including steps of forming atop said fluorinated DLC film, a plurality of additional polymer films and a plurality of fluorinated DLC films, with one of said plurality of additional fluorinated DLC films being disposed between consecutive layers of said plurality of additional polymer films, forming a multi-layered stacked structure, said multi-layered stacked structure having a desired thickness; and forming a final carbon-based film cap on said multi-layered stacked structure.

8. The method of claim 1 wherein said step of forming a polymer film further comprises steps of:
   vaporizing a polymerizable material; and
   flowing the vaporized polymerizable material into a deposition chamber.

9. The method of claims 8 wherein said polymerizable material is a dimer of p-xylylene.

10. The method of claim 9 wherein said dimer of p-xylylene and a carrier gas are passed through a decomposition chamber at a temperature of between 700°–900° C. to convert the dimer to a reactive monomer.

11. The method of claim 7 wherein said multi-layered structure includes five carbon-based layers and four organic layers, and has an overall dielectric constant of less than 3.0.

12. The method as recited in claim 7 wherein said plurality of carbon-based layers have differing quantities of fluorine and carbon present therein with the quantities of fluorine and carbon present in one of said plurality of carbon-based layers being dependent upon a position of said one of said plurality of carbon-based layers amongst said plurality of carbon-based layers.

13. The method as recited in claim 12 wherein said quantity of carbon present in said plurality of carbon-based layers decreases as a distance between said plurality of carbon-based layers and said substrate increases.

14. A method for forming a dielectric film on a substrate comprising steps of:
   placing said substrate in a deposition zone;
   during a first deposition stage introducing, into said deposition zone, a fluorine source and a carbon source so as to obtain a predetermined ratio of said fluorine source to said carbon source to form a first DLC film on said substrate;
   during a second deposition stage, subsequent to said first deposition stage, forming a polymer film atop said first DLC film and
   during a third deposition stage, subsequent to said second deposition stage, increasing said ratio of said fluorine source to said carbon-source to form a second DLC film atop of said polymer film.

15. The method as recited in claim 14 further including a step of forming atop said second DLC film, a plurality of additional polymer films and a plurality of DLC films, with one of said plurality of additional DLC films being disposed between consecutive layers of said plurality of additional polymer films, defining forming a multi-layered stacked structure.

16. The method as recited in claim 15 further including a step of forming a cap layer atop said multilayer structure.

17. A method for forming a dielectric film on a substrate disposed in a process chamber, said method comprising steps of:

placing said substrate in a deposition zone of said process chamber;

forming, on said substrate, a plurality carbon-based layers, with consecutive carbon-based layers having differing thermal conductivity characteristics; and forming, between said consecutive carbon-based layers, a polymer layer, with said plurality of carbon-based layers having differing quantities of fluorine and carbon present therein with the quantities of fluorine and carbon present in one of said plurality of carbon-based layers being dependent upon a position of said one of said plurality of carbon-based layers amongst said plurality of carbon-based layers so that said quantity of carbon present in said plurality of carbon-based layers decreases as a distance between said plurality of carbon-based layers and said substrate increases.

18. The method as recited in claim 17 wherein said quantity of fluorine present in said plurality of carbon-based layers increases as a distance between said plurality of carbon-based layers and said substrate increases.

* * * * *